United States Patent [19]
Luedtke

[11] Patent Number: 5,515,050
[45] Date of Patent: May 7, 1996

[54] APPARATUS AND METHOD FOR ASYNCHRONOUS SUCCESSIVE APPROXIMATION

[75] Inventor: Mark Luedtke, Del Valle, Tex.

[73] Assignee: Advanced Micro Devices, Inc., Sunnyvale, Calif.

[21] Appl. No.: 88,007

[22] Filed: Jul. 6, 1993

[51] Int. Cl.$^6$ ................................................. H03M 1/40
[52] U.S. Cl. ............................................ 341/163; 341/164
[58] Field of Search .................................... 341/163, 164, 341/165

[56] References Cited

U.S. PATENT DOCUMENTS

| | | | |
|---|---|---|---|
| 3,795,900 | 3/1974 | Manford, Jr. | 341/143 |
| 4,083,043 | 4/1978 | Breuer | 341/165 |
| 4,160,243 | 7/1979 | Moriya et al. | 340/347 |
| 4,251,803 | 2/1981 | Debord et al. | 341/118 |
| 4,396,905 | 8/1983 | Chan et al. | 340/347 |
| 4,415,882 | 11/1983 | Akazawa et al. | 341/156 |
| 4,829,302 | 5/1989 | Oitzl et al. | 341/165 |
| 4,908,624 | 3/1990 | Goto et al. | 341/172 |
| 5,057,841 | 10/1991 | Veerhoek et al. | 341/156 |
| 5,252,976 | 10/1993 | Miko et al. | 341/163 |
| 5,272,481 | 12/1993 | Sauer | 341/165 |

OTHER PUBLICATIONS

The Engineering Staff of Analog Devices, Inc., "Analog--Digital Conversion Handbook", 1986, pp. 269–273.
Patent Abstracts of Japan, vol. 17, No. 283, May 31, 1993, & JP-A-50 014 221 (Funai Denki Kenkiyuushiyo) Jan. 22, 1993.
Patent Abstracts of Japan, vol. 10, No. 329, Nov. 8, 1986, & JP-A-61 135 235 (Takano Takeshi) Jun. 23, 1986.

*Primary Examiner*—Marc S. Hoff
*Attorney, Agent, or Firm*—Jenkens & Gilchrist

[57] ABSTRACT

A receive signal strength indication analog-to-digital converter includes a digital portion and an analog portion. The digital portion includes structure for approximating radio frequency receive signal strength in digital form and a state machine implementing a successive approximation algorithm. The analog portion includes a digital-to-analog converter, an analog comparator, and structure for transmitting the output of the digital-to-analog converter to the analog comparator. The receive signal strength indication analog-to-digital converter also includes structure for transmitting the approximate radio frequency receive signal strength in digital form to the digital-to-analog converter and structure for transmitting the output of the comparator to the state machine.

6 Claims, 4 Drawing Sheets

APPARATUS AND METHOD FOR ASYNCHRONOUS SUCCESSIVE APPROXIMATION

CROSS-REFERENCE TO RELATED APPLICATIONS

This application is related to the following U.S. patent applications:

| SERIAL NO. | TITLE | INVENTOR(S) |
|---|---|---|
| (06940/0029; TT0139) | General I/O Port Interrupt Mechanism | Gulick, et al. |
| (06940/0030; TT0140) | Improved External Memory Access Control For a Processing Unit | Bowles, et al. |
| (06940/0031; TT0141) | Method of Weak Pull-up Disable and Mechanism Therefor for Use with Microcontroller in Integrated Circuit and Cordless Telephone Using the Integrated Circuit | Bowles, et al. |
| (06940/0032; TT0142) | Interrupt Mask Disable Circuit and Method | Bowles, et al. |
| (06940/0033; TT0143) | Integrated Circuit and Cordless Telephone Using the Integrated Circuit | Gulick, et al. |
| (06940/0034; TT0144) | Modulator Test System | Peterson, et al. |
| (06940/0035; TT0145) | Keypad Scanner Process and Device and Cordless Telephone Employing the Mechanism | Gulick |
| (06940/0036; TT0146) | Serial Interface Module and Method | Gulick, et al. |
| (06940/0037; TT0147) | Low Power Emergency Telephone Mode | Peterson, et al. |
| (06940/0038; TT0148) | In-Circuit Emulation Capability Mode in Integrated Circuit and Cordless Telephone Using the Integrated Circuit | Gulick, et al. |
| (06940/0039; TT0149) | Clock Generator Capable of Shut-down Mode and Clock Generation Method | Peterson, et al. |
| (06940/0040; TT0150) | Signal Averager | Gulick |

All of the related applications were filed on Jul. 21, 1992, are assigned to the assignee of the present invention, and are hereby incorporated herein in their entirety by this reference thereto.

BACKGROUND OF THE INVENTION

1. Field of the Invention

The present invention relates to analog-to-digital ("A/D") converters and, more particularly, to successive approximation type A/D converters.

2. Description of Related Art

Generally, a successive approximation type A/D converter includes means for sampling an analog voltage input, means for suppling a successive approximation control digital output, means for comparing analog voltages, and means for successively determining values of bits of an A/D conversion output. In operation, a typical successive approximation type A/D converter samples an analog voltage input, supplies a successive approximation control digital output from a successive approximation type control circuit to a local digital-to-analog ("D/A") converter to cause the D/A converter to generate a local analog voltage, compares the sampled and held analog voltage with the local analog voltage, and successively determines the value of each bit of an A/D conversion output on the basis of the relationship in magnitude between the compared voltages. By doing the foregoing, a successive approximation type A/D converter obtains an A/D conversion output having a plurality of bits from the successive approximation type control circuit.

A more detailed description of an algorithmic A/D converter is set forth in the background section of U.S. Pat. No. 5,017,920 to French. The converter described therein includes a signal input line or system input terminal which receives an analog signal. The analog input signal is sampled in sample and hold circuitry. A switch connects the output terminal of the sample and hold circuit to an input terminal of a comparator and to the positive input terminal of a subtractor.

In the example presented in U.S. Pat. No. 5,017,920, the input analog signal is assumed to have a maximum value of Vm. The comparator compares the input signal sample with a threshold voltage Vm/2. If the signal exceeds the threshold voltage, the comparator outputs a one (1).

A switch control connected to the output of the comparator controls the value of voltage applied to the negative input terminal of the subtractor. The subtractor removes a voltage or value corresponding to the threshold exceeded from the input analog signal.

French's switch control applies the appropriate voltage to the negative input terminal of the subtractor. If the comparator outputs a one (1), indicating that the threshold Vm/2 has been exceeded, the switch control applies the voltage Vm/2 to the negative input terminal of the subtractor. If the comparator outputs a zero (0), indicating that the threshold Vm/2 has not been exceeded, the switch control applies zero (0) voltage to the negative input terminal of the subtractor, so that the output of the subtractor has the same applitude as the input. Thus, the most significant bit of the digital representation of the magnitude of the analog signal received on the system input terminal is generated on the comparator output terminal.

The next most significant bit is generated by multiplying the output of the subtractor by two in a multiplier, and repeating the comparison step described above.

French also teaches that his switch closes the connection between a sample and hold circuit connected to the output terminal of the multiplier and the input of the comparator. The doubled output of the subtractor can then be compared with the threshold voltage Vm/2. The output of the comparator [a binary one (1) if the threshold voltage is exceeded, a binary zero (0) if the threshold voltage is not exceeded] is the second most significant bit. The switch control applies either the voltage Vm/2 or a zero voltage to the negative input of the subtractor, so that the subtractor subtracts the voltage from the doubled previous subtractor output.

The third most significant bit may be generated by repeating the process above, as may the fourth most significant bit. Each successive bit generated may be applied to an accumulator comprising a number of delay elements such as flip-flops. Such an accumulator can be used to present a digital representation of the analog signal value received. This can be accomplished by accumulating bits in delay elements, and then allowing the bits to be read out of these elements in the order of most significant bit to least significant bit.

There has been a considerable amount of interest in successive approximation type A/D converters, which interest is evidenced by and has lead to the developments discussed in a multitude of U.S. patents including U.S. Pat. No. 4,293,848 to Cheng et al., U.S. Pat. No. 4,647,903 to Ryu, U.S. Pat. No. 4,908,624 to Goto et al., and U.S. Pat. No. 5,144,310 to Sato. A number of entities now manufacture such converters, and competition among those entities as well as a general scaling down of electronic apparatus in the recent past has created a great demand for relatively inexpensive converters with low power requirements.

Further, as time has passed, more and more uses have been found for successive approximation type converters. A large number of these uses involve telecommunications, wherein analog (e.g., voice) signals are now frequently converted to digital bit streams. A characteristic common to many of these uses is asynchronous requester behavior. Such behavior, frankly, has not been a primary focus of prior art successive approximation converters. Not surprisingly, therefore, the prior art lacks a successive approximation type converter well suited to handle asynchronous signals, configured so as to be easily manufactured, and designed so as to draw minimal power. The lack of such a converter is a shortcoming and deficiency of the prior art.

SUMMARY OF THE INVENTION

The present invention overcomes the shortcomings and deficiencies of the prior art by providing an digital-to-analog converter; structure for transmitting an approximate RF receive signal strength in digital form signal to the digital-to-analog converter; an analog comparator operable to compare a signal against a receive signal strength indication ("RSSI") signal; structure for transmitting the output of the digital-to-analog converter to the analog comparator for comparison against the RSSI signal; a state machine implementing a successive approximation algorithm; and structure for transmitting the output of the comparator to the state machine.

Accordingly, it is an object of the present invention to provide a fully asynchronous implementation of a successive approximation algorithm.

Another object of the present invention is to facilitate integration to an asynchronous requester in a RSSI A/D converter environment.

Yet another object of the present invention is to provide a low power operation RSSI A/D converter that can handle immediate and controlled requests.

Still yet another object of the present invention is to provide extremely fast apparatus for asynchronous successive approximation.

BRIEF DESCRIPTION OF THE DRAWINGS

Other objects, advantages, and novel features of the present invention will become apparent from the following detailed description of the invention when taken in conjunction with the accompanying drawings wherein.

DETAILED DESCRIPTION OF THE INVENTION

Figure 1:
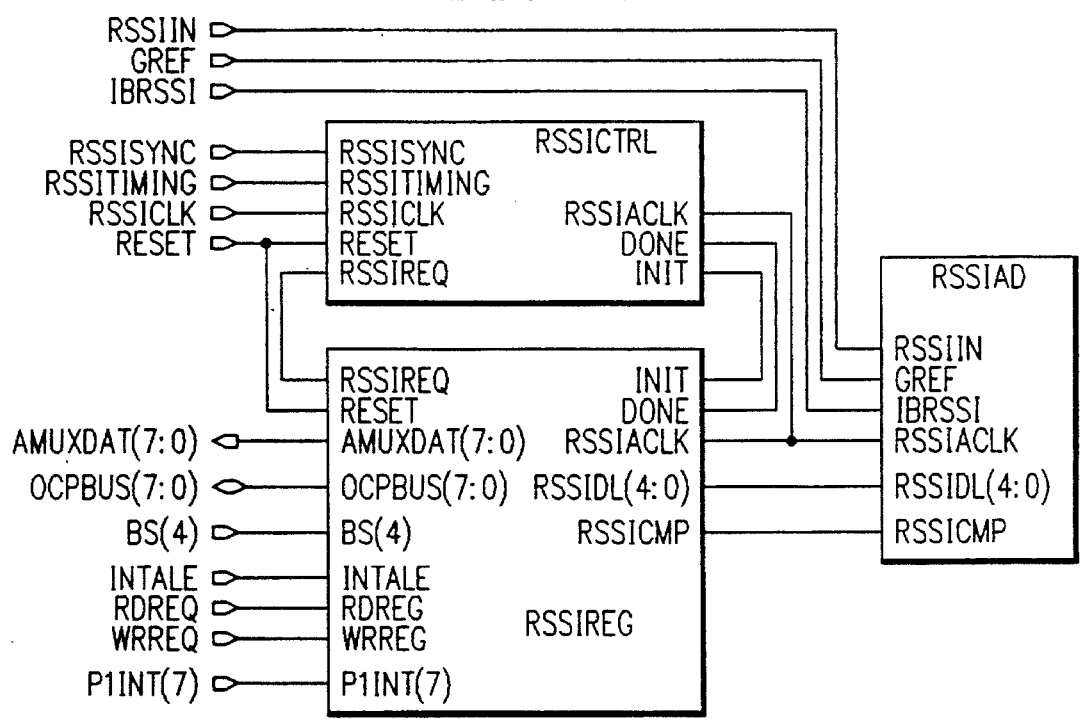
FIG. 1 is a block diagram of an RSSI A/D converter according to the teachings of the present invention.

Referring now to the drawings wherein like or similar elements are depicted with identical reference numerals throughout the several views and, more particularly, to FIG. 1, there is shown a block diagram of a RSSI A/D converter, generally designated by reference numeral 10, according to the teachings of the present invention.

The RSSI A/D converter 10 shown in FIG. 1 may be seen to comprise a control block ("RSSICTRL") 12, a digital ("RSSIREG") block 14, and an analog ("RSSIAD") block 16. The control block 12 comprises a pulse remover. The digital block 14 comprises a RSSI status register and a state machine implementing a successive approximation algorithm. Each of these elements is discussed in greater detail below. The analog block 16 comprises a D/A converter and an analog comparator. Likewise, both of these two elements are discussed in greater detail below.

In general, the purpose of converter 10 is to determine the value of an analog signal to a number of bits of resolution, e.g., five (5) bits of resolution. Generally, to accomplish this purpose, the digital portion 14 of the converter 10 passes an appropriate approximation on to the D/A converter of the analog portion 16. The output of the D/A converter is then applied to the comparator of the analog portion 16. There, the D/A converter output is compared to the RSSI signal. Based upon the results of this comparison, that is, based upon the output of the comparator, the state machine within the digital block 14 is adjusted so as to appropriately modify the approximation referred to above. This cycle is repeated by each of, e.g., five (5) bits. At that point, a final result will be obtained.

At this point it is appropriate to discuss the interaction of the blocks 12, 14, and 16 depicted in FIG. 1 in greater detail. To do this, each of the signals passed to and out of each of those blocks 12, 14, and 16 will now be discussed.

The aforementioned signals can be neatly divided into digital signals and analog signals, and likewise neatly divided into input signals and output signals, to thereby form four separate categories. These categories are digital input signals, analog input signals, digital output signals, and analog output signals. Each of these four categories of signals is discussed in an individual paragraph immediately below.

There are nine (9) digital input signals. Three (3) of the digital input signals; depicted as signals RSSISYNC 18, RSSITIMING 20, and RSSICLK 22 in FIG. 1; are input into the control block 12. Four (4) of the digital input signals; depicted as BS(4) 24, INTALE 26, read request ("RDREQ") 28, and write request ("WRREQ") 30 in FIG. 1; are input into the RSSIREG block 14. Another digital input signal, RESET signal 32, can be seen in FIG. 1 to be input to both the RSSICTRL block 12 and the RSSIREG block 14. A final digital input signal, RSSICMP signal 34, is an output of the RSSIAD block 16 that is input to the RSSIREG block 14.

There are six analog input signals for converter 10. One of these is RSSIIN signal 36, which is an analog voltage from a RSSI input pin. A second such signal is GREF signal 38, which is merely an analog full scale voltage signal. RSSIDL (4:0) signal 40 represents code sent from block 14 to block 16. Signal 40 is asynchronous, and in an actually constructed embodiment of the present invention which has heretofore been made and tested with great success, is capable of changing approximately once every 2 microseconds and is negative true. The RSSIACLK signal 42 is output from block 12 and input to both blocks 14 and 16.

This signal 42 is used in embodiments of the present invention to strobe the comparator within block 16 after each change in D/A code. This signal 42 may be synchronized to code changes in conformance with a timing scheme discussed below with references to FIG. 4. To give those skilled in the art an idea of values that could, by way of example only, be associated with signal 42, it may be noted that in the actually constructed embodiment of the present invention the minimum pulse width is assumed to be 200 nanoseconds and D/A settling time prior to the rising edge of this signal 42 is assumed to be 1.4 microseconds. There are two other analog input signals. One of them, depicted in FIG. 1 as IBRSSI signal 44, is input directly into the RSSIAD block 16. Signal 44 is a bias current for use in the comparator within block 16. In the actually constructed embodiment of the present invention mentioned above, signal 44 has a nominal value of 5 µA. The last of the analog input signals is an ENREG1(0) signal (not shown in FIG. 1). The ENREG1(0) signal is merely an enable input to the entire converter 10. ENREG1(0) maybe used to power down the comparator within block 16. Of course, for the converter 10 to work, GREF 38 and IBRSSI 44 must be active in addition to ENREG1(0).

There are two digital output signals, both of which have been discussed above in connection with their "input" characteristics. For the sake of completeness, however, it may be noted that the RSSIDL (4:0) signal 40 and the RSSIACLK signal 42 are both digital output signals, from block 14 and block 12, respectively. The RSSIDL (4:0) signal 40 is applied to the analog D/A converter in block 16. The RSSIACLK signal 42 is specifically applied to the analog comparator in block 16.

The RSSICMP signal 34, previously discussed, is also effectively an analog output signal. Specifically, the RSSICMP signal 34 is the output of the comparator within block 16. In the actually constructed embodiment of the present invention this output is valid only when the RSSIACLK signal 42 is high. In operation the comparator output may be logic "1" if the RSSI input is greater than the D/A output and logic "0" if the RSSI input is lower than the D/A output. A logic "1", in turn, can leave the current data bit set in the successive approximation algorithm while a logic "0" can clear that bit. Of course, those skilled in the art will recognize that the "set" and "clear" concepts mentioned above apply to positive logic code; in the actually constructed embodiment of the present invention, the code sent to the analog block 16 is negative true logic. In operation of the converter 10, the comparator output is held high when the RSSIACLK signal 42 is low.

Discussing element interaction further, those skilled in the art should recognize and appreciate that the "control" state machine is asynchronous from the "algorithmic" state machine. The latter, however, needs a "handshake" signal to know when RSSICMP 34 is valid. Because the analog circuit has no way of knowing when the compare is complete, for convenience, the compare may be designed to complete within a certain time period (e.g., within 500 nanoseconds), and clock signals (here, RSSICLK signal 22 and RSSIACLK signal 42) used to effectively advise the algorithmic state machine when RSSICMP is valid. Thus, the clock signals 22 and 42 have no real bearing upon the two state machines forming the control and data (algorithmic) sections of the actually constructed embodiment of the present invention described herein beyond the fact, discussed above, that the RSSIACLK signal 42 can be used as a "handshake" signal.

In addition to all of the foregoing, it warrants mentioning that the entire converter 10 has an asynchronous input/output ("I/O") connection in the form of an on-chip peripheral bus ("OCPBUS") (7:0) 46. OCPBUS timing plays an important role in embodiments of the present invention, as is discussed further below.

Figure 2:
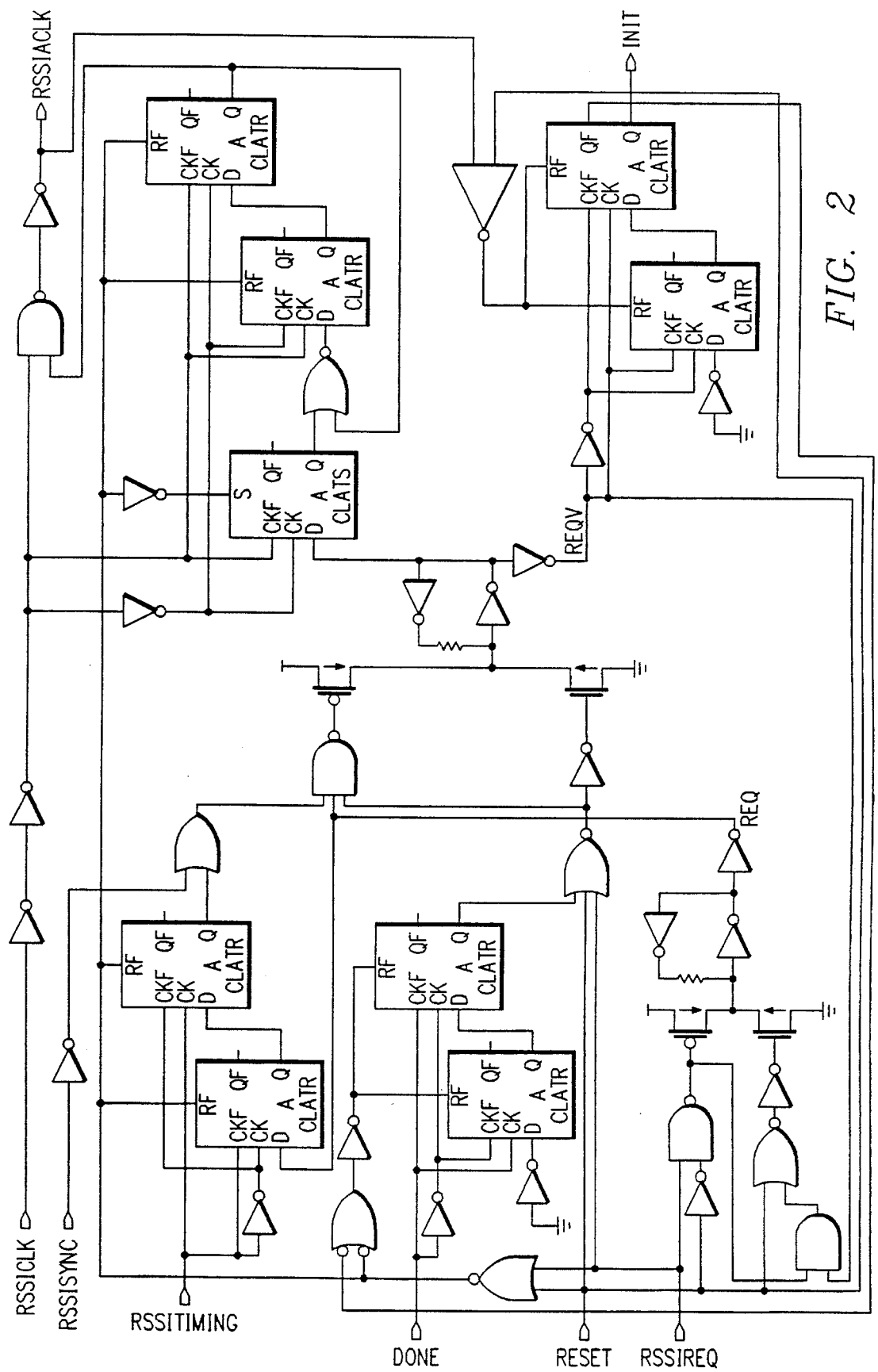
FIG. 2 is a detailed schematic diagram of the control block portion of the RSSI A/D converter shown in FIG. 1.
Figure 3A:
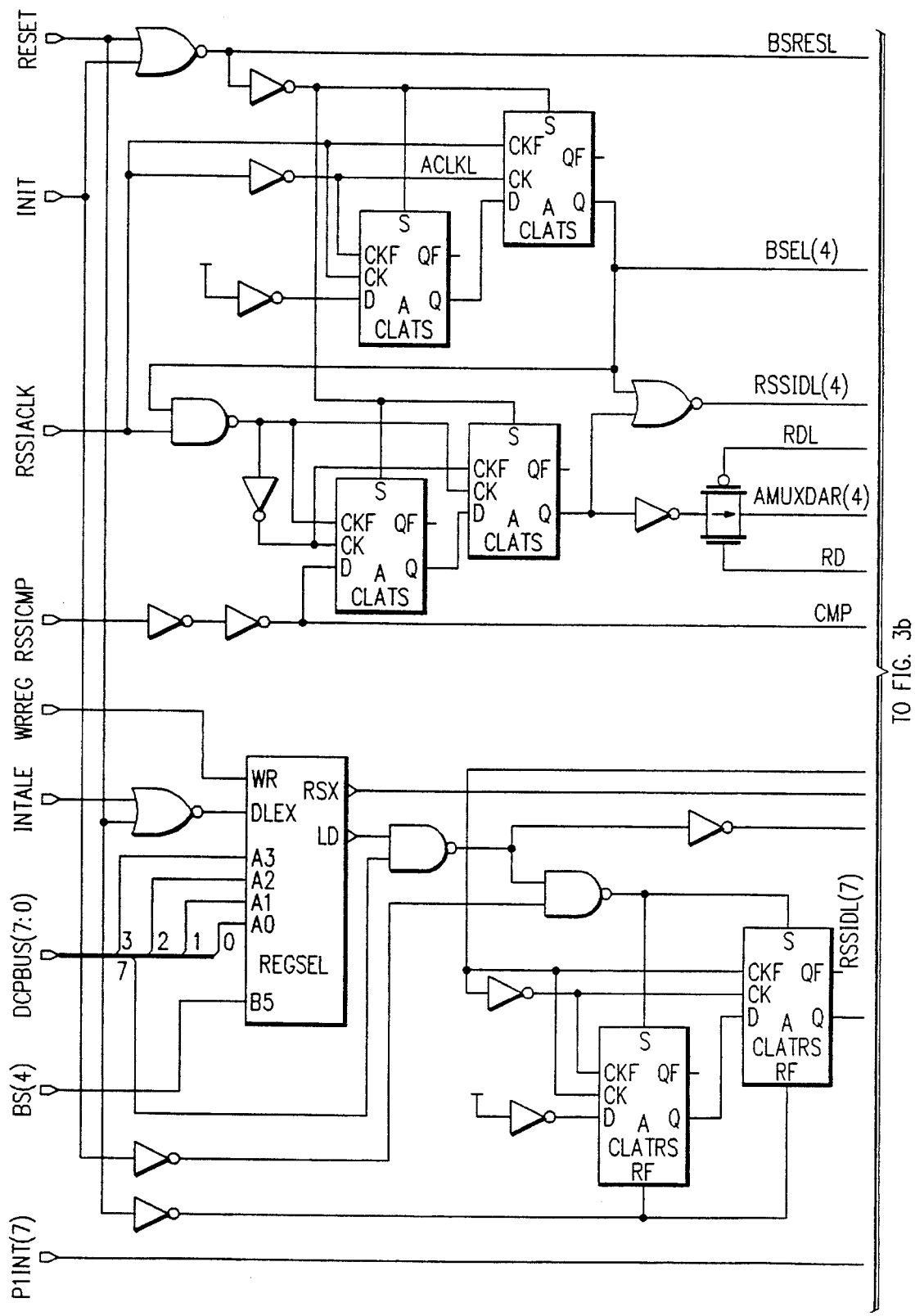
FIGS. 3a and 3b (hereinafter referred to in concert as "FIG. 3") is a detailed schematic diagram of the state machine and RSSI status register of the RSSI A/D converter shown in FIG. 1.
Figure 3B:
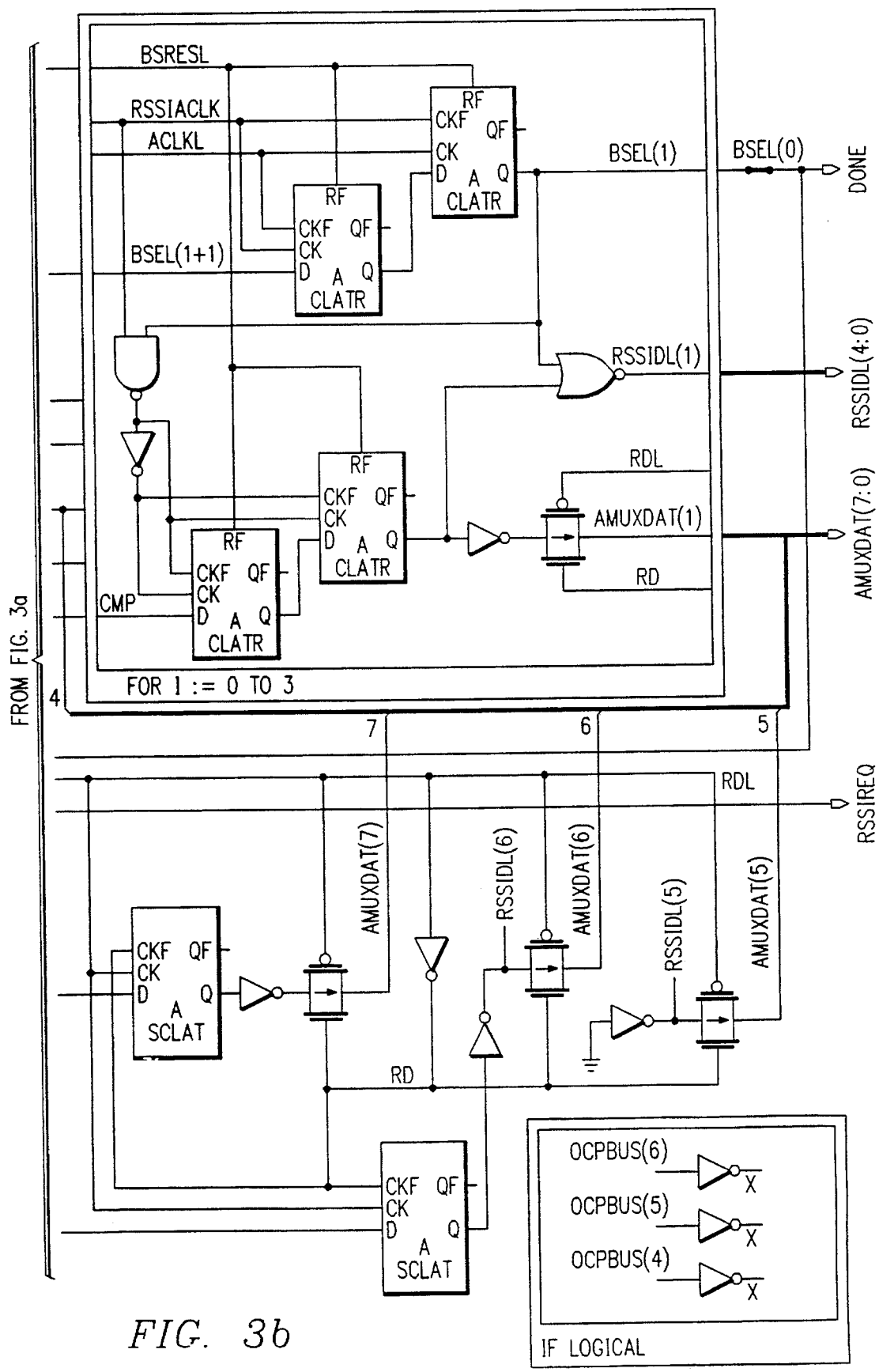

Referring now to FIGS. 2 and 3, there are shown, respectively, detailed schematic diagrams of a possible RSSICTRL block 12 and a possible RSSIREQ block 14. These detailed schematic diagrams are presented as examples only, and should not in any way be construed to limit the scope of the present invention. The schematic diagrams of FIGS. 2 and 3 provide well more than enough details to enable those skilled in the art to practice the present invention and, further, effectively present details on the construction of the actually implemented embodiment of the present invention, discussed at various points above.

Although it is neither necessary nor appropriate to discuss minute details of the actually constructed embodiment of the present invention depicted, in part, in FIGS. 2 and 3, certain requirements and a specific functional overview may facilitate the understanding of the present invention by those skilled in the art. Generally, once again, RSSI A/D converter 10 provides a digital representation of a RF receive signal level.

Regarding specific requirements, the actually constructed embodiment of the present invention has a resolution of 5 bits, a full scale error equal to ±5% of the nominal full scale voltage, and a zero code offset error of ±5% of the nominal zero code voltage +10 mV. Regarding differential linearity, a value of ±0.05 LSB, with ±1 integrity, is obtained and, further, monotonicity is guaranteed. Finally, the converter 10 has a very high impedance, e.g., at least 1M ohm, because of the source impedance of the RSSI signal.

Functionally, with regard to current to voltage translation in embodiments of the present invention, an external frequency-shift keying ("FSK") demodulator generates an analog signal having a current that proportional to the receive signal strength. This output current is terminated in an external resistor to translate it into a voltage. The value of the external resistor is determined based upon the full scale voltage of the RSSI A/D and the full scale output current from the demodulator IC according to the equation $R_{EXT} = V_{FULLSCALE}/I_{FULLSCALE}$.

In the heretofore actually constructed embodiment of the present invention, the allowable input range of the A/D converter is determined primarily by the common mode voltage swing of the input comparator. Further, it is defined as 1.25 V (full scale) to 0.236 V (zero code).

To obtain an A/D conversion in the actually constructed embodiment of the present invention, the A/D converter must be enabled and a conversion requested. A conversion operation is requested by the setting of a select bit in a RSSI status register. When the select bit is set, and if the synchronization signal is low (indicating here that the "radio" is not in burst mode and is always receiving) the A/D converter will perform a conversion and load the result into the status register. If, on the other hand, the synchronization signal is high, a conversion will not be performed until triggered by the next rising edge of the RSSI timing signal. This is because in the actually constructed embodiment of the present invention, when the synchronization signal is high the radio is in burst mode. In burst mode, the A/D converter must wait until the RSSI timing signal goes high during the next receive period before sampling the RSSI level.

When the conversion cycle described above is complete, the select bit is cleared by hardware. That action signals that the microcontroller can then read the RSSI value from the RSSI status register.

Figure 4:
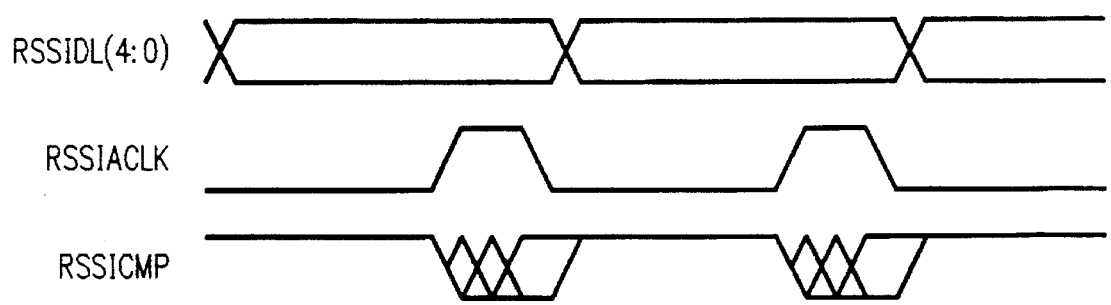
FIG. 4 is a timing chart depicting certain relationships within embodiments of the present invention.

Referring now to FIG. 4, there is shown a timing diagram wherein important relationships between various of the signals discussed above are prescribed. In viewing FIG. 4, it is important to realize that OCPBUS timing applies. Two and a half cycles are depicted in FIG. 4. As shown in FIG. 4, when the clock falls, data is updated. Thus, the RSSIDL (4.0) signal 40, the RSSIACCK signal 42, and RSSICMP signal 34 must be synchronized as shown.

Based upon the foregoing, those skilled in the art should now fully understand and appreciate the present invention. The present invention, broadly, provides a fully asynchronous implementation of a successive approximation algorithm. More specifically, the present invention provides a low power operation RSSI A/D converter that can handle immediate and controlled requests.

An important aspect of embodiments of the present invention is that the state machine, which is effectively driven by the RSSICLK signal 22, is totally asynchronous to the system 10. Thus, there is no restriction on when an RSSI request may occur relative to system timing. The design prescribed by the teachings herein creates a highly modular block (which can be easily incorporated into another system with different timing, possibly merely by modifying the bus interface) with low power requirements (as it represses the clock when not actively interpolating). The fact that the design does not use ratioed logic also contributes to low power use, ease of manufacture, and reliability.

Obviously, numerous modifications and variations are possible in view of the teachings above. For example, it is possible that the RSSICLK signal 22 could be generated internally within the block 12; the point being that the block 12 remains asynchronous to the system 10. Other variations are possible. Accordingly, within the scope of the appended claims, the present invention may be practiced otherwise than as specifically described hereinabove.

What is claimed is:

1. A receive signal strength indication analog-to-digital converter comprising:

a digital portion including:

approximation means for generating a digital approximation of a received analog signal based on a successive approximation feedback signal; and an algorithm state machine that produces, based upon a compare output signal, the successive approximation feedback signal asynchronously of the received analog signal when an asynchronous mode is enabled;

an analog portion including:

a digital-to-analog converter operably coupled to convert the digital approximation into an approximation analog signal; and an analog comparator operably coupled to compare the approximation analog signal with the received analog signal and to provide the compare output signal to the algorithm state machine;

a control portion that includes;

a control state machine operably coupled to the analog portion and the digital portion, the control state machine provides a handshake signal to the digital portion such that the digital portion is notified when the compare output signal is valid and provides control signals to the analog portion and the digital portion to controlling commencement and completion of an analog to digital conversion, and wherein the control state machine operates asynchronously from the algorithm state machine.

2. A converter as recited in claim 1, wherein the control portion further comprises synchronization circuitry that, when enable, places the algorithm state machine in a synchronous mode and, when disabled, places the algorithm state machine in the asynchronous mode.

3. A converter as recited in claim 1, wherein said converter operates cyclically for a predetermined plurality of input bits at which point a result is reached.

4. A converter as recited in claim 3, wherein said predetermined plurality of input bits is equal to five input bits.

5. A method for performing a successive approximation analog-to-digital conversion, the method comprising the steps of:

receiving an analog signal to produce a received analog signal;

executing, based on control information, a successive approximation analog-to-digital conversion of the received analog signal asynchronously to the receiving of the analog signal when in an asynchronous mode; and generating the control information asynchronously from the executing the successive approximation, wherein the control information indicates commencement and completion of the successive approximation.

6. A method as recited in claim 5 further comprises the step of generating a mode control signal to perform the successive approximation in the asynchronous mode when a synchronization signal is in a first state, and generating the mode control signal to perform the successive approximation in a synchronous mode when the synchronization signal is in a second state.

\* \* \* \* \*

UNITED STATES PATENT AND TRADEMARK OFFICE
CERTIFICATE OF CORRECTION

PATENT NO. : 5,515,050
DATED : May 7, 1996
INVENTOR(S) : Luedtke

It is certified that error appears in the above-indentified patent and that said Letters Patent is hereby corrected as shown below:

Column 8, line 6    Replace ";"
                        With --:--

Column 8, line 20   Replace "enable"
                        With --enabled--

Signed and Sealed this

Fifteenth Day of July, 1997

Attest:

BRUCE LEHMAN

*Attesting Officer*    *Commissioner of Patents and Trademarks*